(12) United States Patent
Su et al.

(10) Patent No.: US 7,251,576 B2
(45) Date of Patent: Jul. 31, 2007

(54) SYSTEM AND METHOD FOR TESTING CMOS IMAGE SENSOR

(75) Inventors: Heng-Lung Su, Kaoshiung (TW); Wei-Pin Huang, Kaoshiung (TW); Chang-Shuo Lee, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 11/200,040

(22) Filed: Aug. 10, 2005

(65) Prior Publication Data

US 2006/0036391 A1    Feb. 16, 2006

(30) Foreign Application Priority Data

Aug. 13, 2004   (TW) ............... 93124457 A

(51) Int. Cl.
*G01R 31/00* (2006.01)
*G06F 19/00* (2006.01)

(52) U.S. Cl. ............... 702/117; 702/116; 702/122

(58) Field of Classification Search ............... 702/108, 702/116, 117, 121, 122; 250/559.19, 559.22
See application file for complete search history.

(56) References Cited

U.S. PATENT DOCUMENTS

| 6,326,142 | B1 * | 12/2001 | Royer ............... 435/6 |
| 6,625,558 | B1 | 9/2003 | Van Ausdall et al. |
| 6,797,933 | B1 * | 9/2004 | Mendis et al. ......... 250/208.1 |
| 2004/0076325 | A1 * | 4/2004 | Wada et al. ............. 382/154 |

* cited by examiner

*Primary Examiner*—Bryan Bui
(74) *Attorney, Agent, or Firm*—Volentine & Whitt, P.L.L.C.

(57) ABSTRACT

A system and method for testing CMOS image sensors includes a test supporter, a light source controller, an interface card and an image processor. The test supporter supports a CMOS image sensor under test. The light source controller provides a test light to the CMOS image sensor under test. The interface card includes a signal processor and an output port. The signal processor receives a testing data from the CMOS image sensor under test and processes corresponding output data to the output port according to a predetermined output mode. The image processor determines the output mode, and has an input port corresponding to the output port for receiving the output data from the interface card. The image processor determines whether the CMOS image sensor under test is good or not. Therefore, the system can utilize image processors manufactured by various test system manufacturers so as to broaden compatibility.

5 Claims, 3 Drawing Sheets

SYSTEM AND METHOD FOR TESTING CMOS IMAGE SENSOR

BACKGROUND OF THE INVENTION

1. Field of the Invention

The present invention relates to a system and method for testing, and particularly to a system and method for testing CMOS image sensor.

2. Description of the Related Art

With reference to FIG. 1, a conventional system 10 for testing CMOS image sensor disclosed in U.S. Pat. No. 6,625,558 comprises a test supporter 11, a light source controller 12, an image processor 13 and a tester 14. The test supporter 11 is used to support a CMOS image sensor (not shown) under test. The light source controller 12 provides with a test light to the CMOS image sensor under test.

When the test begins, a control signal is sent from the image processor 13 or the tester 14 such that the light source controller 12 provides a predetermined test light to the CMOS image sensor under test. After the test light is received by the CMOS image sensor under test, the test supporter 11 outputs an image data waveform to the image processor 13. The image processor 13 comprises an interface card 131 for receiving the image data waveform output from the test supporter, and a digital processor for processing to obtain the corresponding pixel data. The image processor 13 determines whether the CMOS image sensor under test is good or not according to the processed pixel data. The tester 14 is connected to the image processor 13 for controlling the image processor 13 and storing the data of the image processor 13.

In the conventional system 10, the interface card 131 and the digital processor are disposed in the image processor 13 or the test supporter 11. The data format and the data output connector of the image processor 13 and the test supporter 11 and the interface card 131 are different from various test system manufacturers. The data format and the data output connector designed by different test system manufactures are totally different. For example, it is impossible to connect the image processor of one manufacturer to the test supporter of another manufacturer. Alternatively, the digital processor is fixed in the image processor 13, and cannot be extended freely as required.

Therefore, it is necessary to provide a system and method for testing CMOS image sensor to solve the above problems.

SUMMARY OF THE INVENTION

The object of the present invention is to provide a system and method for testing CMOS image sensor. The system for testing CMOS image sensor comprises: a test supporter, a light source controller, an interface card and an image processor. The test supporter is used to support a CMOS image sensor under test. The light source controller provides a test light to the CMOS image sensor under test. The interface card comprises a signal processor, an adjustable connector and an output port. The signal processor is used for receiving a testing data from the CMOS image sensor under test, and for processing to obtain the corresponding output data. The adjustable connector adjusts the connection between the output wires of the output data and the output port according to a predetermined output mode. The image processor determines the output mode, and has an input port corresponding to the output port so as to receive the output data from the interface card. The image processor is used to determine whether the CMOS image sensor under test is good or not.

Therefore, the system for testing CMOS image sensor of the present invention utilizes the adjustable connector of the interface card to adjust the connection between the output wires of the output data and the output port according to the output mode of the different image processor, such that the output pins of the output port can be adjusted flexibly to meet the predetermined output mode, and match the input port of the image processor. Consequently, the system for testing CMOS image sensor of the present invention can utilize the image processor manufactured from various test system manufacturers, without being limited to the image processor of a certain trademark. Therefore, the compatibility of the element of the system for testing CMOS image sensor of the present invention is broadened.

DETAILED DESCRIPTION OF THE INVENTION

Figure 1:
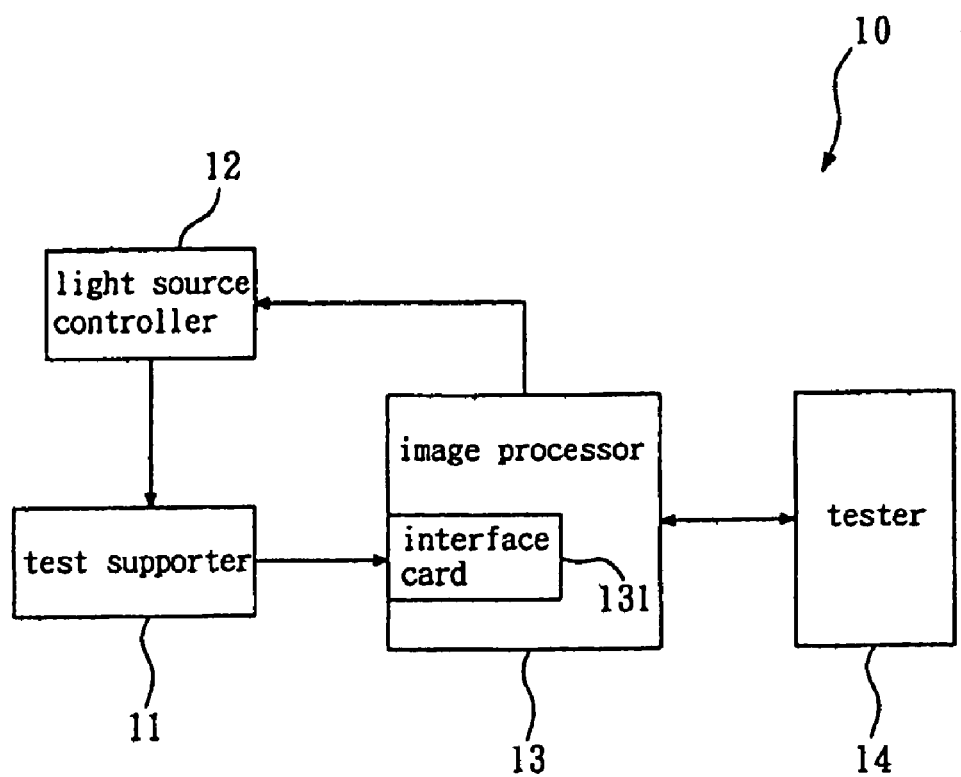
FIG. 1 is a schematic view of the conventional system for testing CMOS image sensor.
Figure 2:
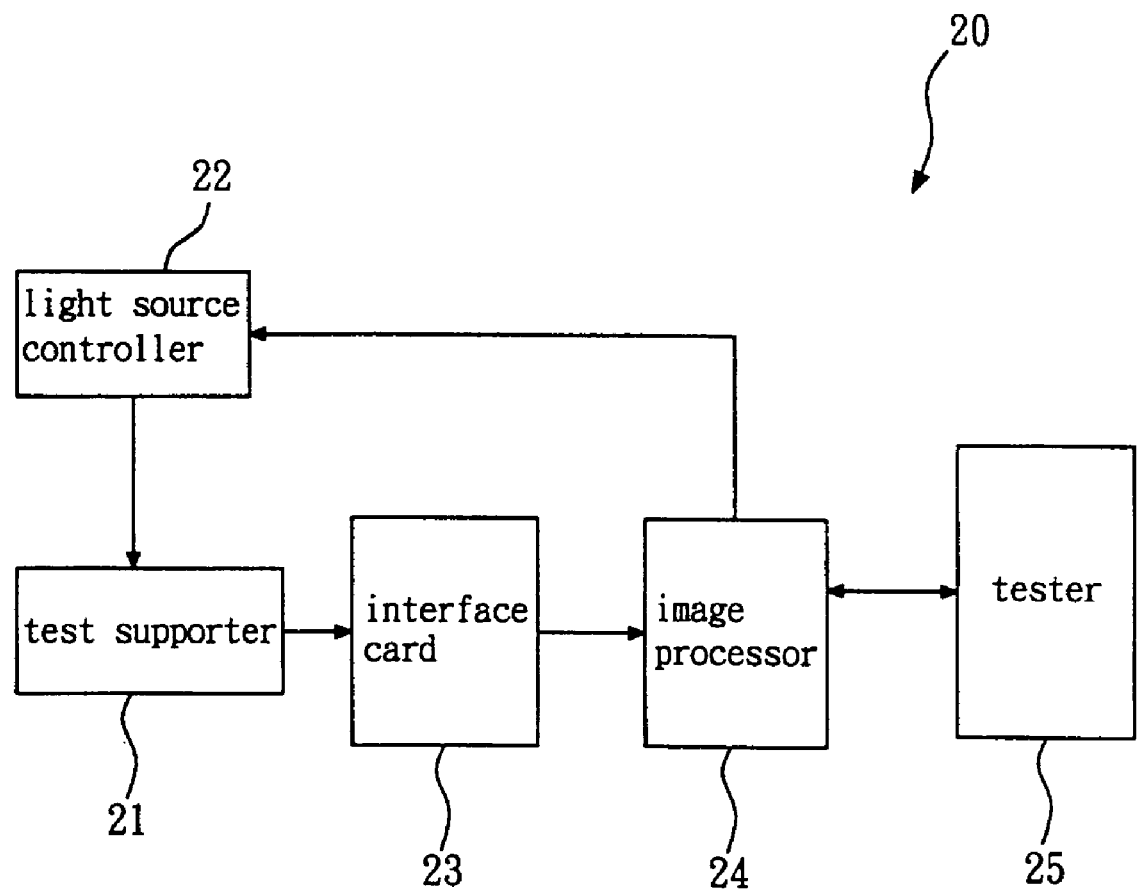
FIG. 2 is a schematic view of a system for testing CMOS image sensor of the present invention.

With reference to FIG. 2, it is a schematic view of a system 20 for testing CMOS image sensor of the present invention. The system 20 for testing CMOS image sensor comprises: a test supporter 21, a light source controller 22, an interface card 23, an image processor 24 and a tester 25. The test supporter 21 is used to support a CMOS image sensor (not shown) under test. The light source controller 22 provides a test light to the CMOS image sensor under test.

When the test begins, the CMOS image sensor under test is disposed in the test supporter 21 first, e.g. the mechanical table having load/unload devices under test (DUT) and function of inputting/outputting signals. A control signal is sent from the image processor 24 or the tester 25 such that the light source controller 22 provides a predetermined test light to the CMOS image sensor under test. In this embodiment, the image processor 24 controls the light source controller 22 to emit the predetermined test light. After the test light is received by the CMOS image sensor under test, it outputs a corresponding testing data (an image data waveform in this embodiment) to the test supporter 21 according to the test light. The test supporter 21 outputs the image data waveform to the interface card 23.

Figure 3:
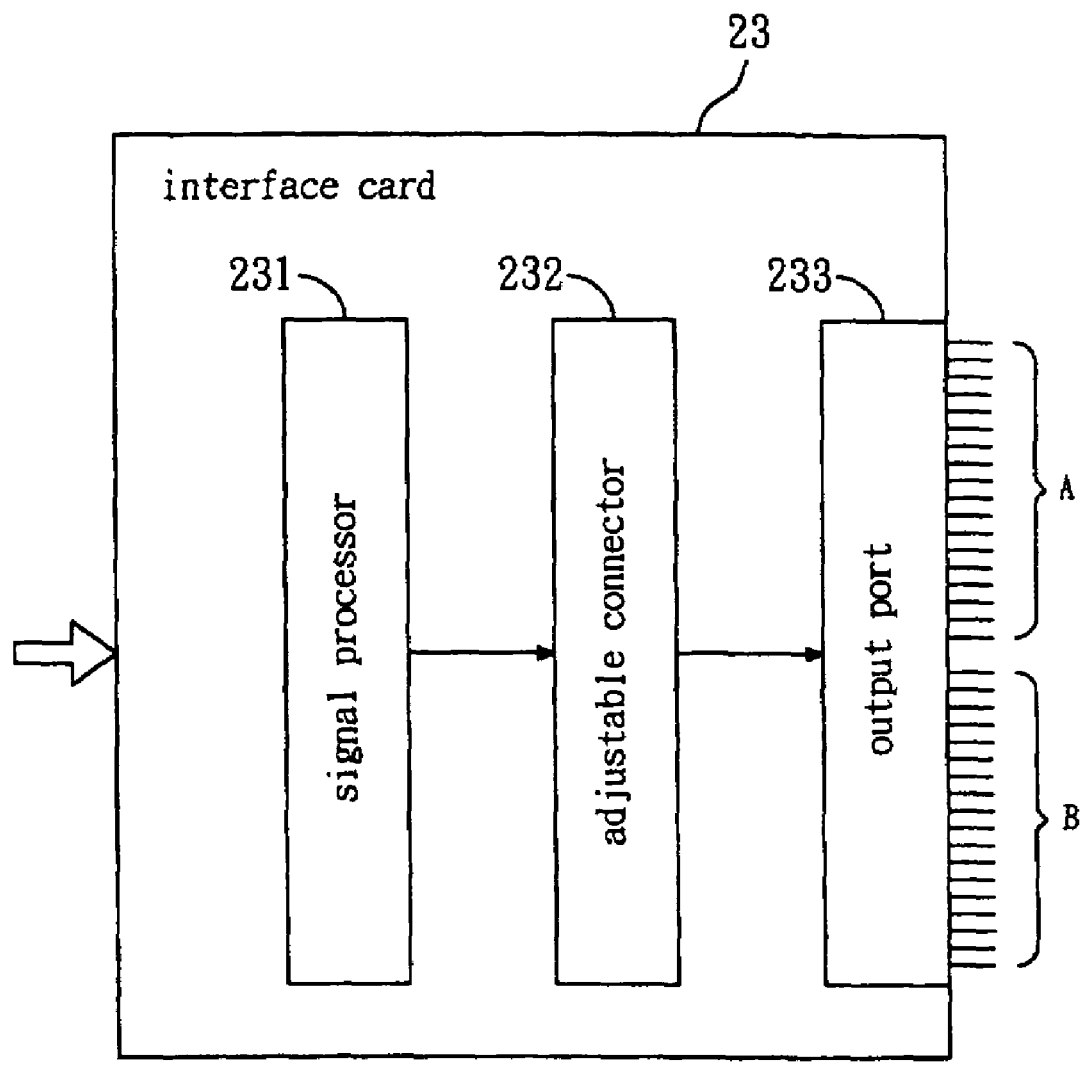
FIG. 3 is a schematic view of an interface card of the present invention.

With reference to FIG. 3, the interface card 23 comprises a signal processor 231, an adjustable connector 232 and an output port 233. The signal processor 231 is used for receiving the image data waveform from the test supporter 21, and for processing to obtain the corresponding output data (pixel data in this embodiment). The adjustable connector 232 adjusts 15 the connection between the output wires of the pixel data and the output port 233 according to a predetermined output mode. The adjustable connector 232 can adjust the connection between the output wires of the pixel data and the output port 233 with jumper or other adjusting approaches, such that the output pins of the output port 233 (including part A, part B, etc.) can be adjusted flexibly to meet the predetermined output mode.

The image processor 24 determines the predetermined output mode, i.e. the adjustable connector 232 of the interface card 23 adjusts the connection according to the output mode of the image processor 24 to match the image processor 24. Therefore, the image processor 24 has an input port (not shown) corresponding to the output port 233 of the interface card 23 so as to receive the pixel data output from the interface card 23. The image processor is used to determine whether the CMOS image sensor under test is good or not.

The tester 25 is connected to the image processor 24 for controlling the image processor 24 and storing the data of the image processor 24. Preferably, both the image processor 24 and the tester 25 are provided with a network address to facilitate communication of the data via a network.

Therefore, the system 20 for testing CMOS image sensor of the present invention utilizes the adjustable connector 232 of the interface card 23 to adjust the connection between the output wires of the pixel data and the output port 233 according to the output mode of the different image processor 24, such that the output pins of the output port 233 (including part A and part B etc.) can be adjusted flexibly to meet the predetermined output mode, and match the input port of the image processor 24. Consequently, the system 20 for testing CMOS image sensor of the present invention can utilize the image processor manufactured from various test system manufacturers, without being limited to the image processor of a certain trademark, and the capacity of the image processor 24 can be extended freely. Therefore, the compatibility of the element of the system for testing CMOS image sensor of the present invention is broadened.

While an embodiment of the present invention has been illustrated and described, various modifications and improvements can be made by those skilled in the art. The embodiment of the present invention is therefore described in an illustrative, but not restrictive, sense. It is intended that the present invention may not be limited to the particular forms as illustrated, and that all modifications which maintain the spirit and scope of the present invention are within the scope as defined in the appended claims.

What is claimed is:

1. A system for testing CMOS image sensors, comprising:

a test supporter that supports a CMOS image sensor under test;

a light source controller that provides a test light to the CMOS image sensor under test;

an interface card, having a signal processor and an output port, the signal processor receiving a testing data from the CMOS image sensor under test and processing corresponding output data to the output port according to a predetermined output mode; and an image processor that determines the predetermined output mode, and having an input port corresponding to the output port of the interface card so as to receive the output data from the interface card, to thereby determine whether the CMOS image sensor under test is good or not, wherein the interface card is disposed independently of the image processor and the test supporter, and wherein the interface card further comprises an adjustable connector that adjusts the connection between output wires of the output data and the output port according to the predetermined output mode.

2. The system as claimed in claim 1, further comprising a tester connected to the image processor, the tester controlling the image processor and storing the data of the image processor.

3. The system as claimed in claim 2, wherein the image processor and the tester are connected via a network.

4. The system as claimed in claim 1, wherein the testing data is an image data waveform, and the output data is pixel data.

5. The system as claimed in claim 1, wherein the adjustable connector adjusts the connection between the output wires of the output data and the output port by a jumper.

* * * * *